(12) United States Patent
Tung

(10) Patent No.: US 9,960,163 B2
(45) Date of Patent: May 1, 2018

(54) METHOD FOR FABRICATING FIN-SHAPED STRUCTURE AND BUMP MADE OF DIFFERENT MATERIAL

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/134,367

(22) Filed: Apr. 20, 2016

(65) Prior Publication Data

US 2017/0278845 A1 Sep. 28, 2017

(30) Foreign Application Priority Data

Mar. 22, 2016 (TW) .............................. 105108729 A

(51) Int. Cl.
| | |
|---|---|
| *H01L 27/092* | (2006.01) |
| *H01L 21/8238* | (2006.01) |
| *H01L 21/762* | (2006.01) |
| *H01L 29/06* | (2006.01) |
| *H01L 29/165* | (2006.01) |
| *H01L 29/267* | (2006.01) |
| *H01L 21/306* | (2006.01) |

(52) U.S. Cl.
CPC .... *H01L 27/0924* (2013.01); *H01L 21/30625* (2013.01); *H01L 21/76224* (2013.01); *H01L 21/823821* (2013.01); *H01L 21/823878* (2013.01); *H01L 29/0649* (2013.01); *H01L 29/165* (2013.01); *H01L 29/267* (2013.01)

(58) Field of Classification Search
CPC ..................... H01L 27/0924; H01L 21/823821
See application file for complete search history.

(56) References Cited

U.S. PATENT DOCUMENTS

| | | | |
|---|---|---|---|
| 7,348,284 B2 | 3/2008 | Doyle et al. | |
| 7,799,592 B2 | 9/2010 | Lochtefeld | |
| 9,330,984 B1* | 5/2016 | Leobandung | ......... H01L 21/845 |
| 2013/0330889 A1* | 12/2013 | Yin | .................... H01L 21/82382 |
| | | | 438/197 |
| 2014/0284723 A1* | 9/2014 | Lee | ...................... H01L 27/0924 |
| | | | 257/369 |
| 2015/0206759 A1 | 7/2015 | Tsao et al. | |
| 2015/0318176 A1 | 11/2015 | Qi et al. | |
| 2015/0325646 A1* | 11/2015 | Lai | ...................... H01L 29/7851 |
| | | | 257/369 |

* cited by examiner

*Primary Examiner* — Daniel Whalen
(74) *Attorney, Agent, or Firm* — Winston Hsu

(57) ABSTRACT

A method for fabricating semiconductor device is disclosed. First, a substrate is provided, a first fin-shaped structure and a bump are formed on the substrate, and an insulating layer is formed on the bump and around the first fin-shaped structure. Next, a part of the first fin-shaped structure is removed, an epitaxial layer is formed on the first fin-shaped structure, part of the epitaxial layer is removed, and part of the insulating layer is removed to form a shallow trench isolation (STI) and a second fin-shaped structure protruding from the STI. Preferably, the second fin-shaped structure includes a top portion and a bottom portion, in which the bottom portion and the bump are made of same material.

3 Claims, 13 Drawing Sheets

METHOD FOR FABRICATING FIN-SHAPED STRUCTURE AND BUMP MADE OF DIFFERENT MATERIAL

BACKGROUND OF THE INVENTION

1. Field of the Invention

The invention relates to a method for fabricating semiconductor device, and more particularly, to a method of forming fin-shaped structures and bumps composed of different material on a substrate.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate; and forming a first fin-shaped structure and a bump on the substrate, in which the first fin-shaped structure and the bump are composed of different material.

According to another aspect of the present invention, a semiconductor device is disclosed. The semiconductor device includes: a substrate; and a fin-shaped structure and a bump on the substrate, in which the fin-shaped structure and the bump comprise different material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
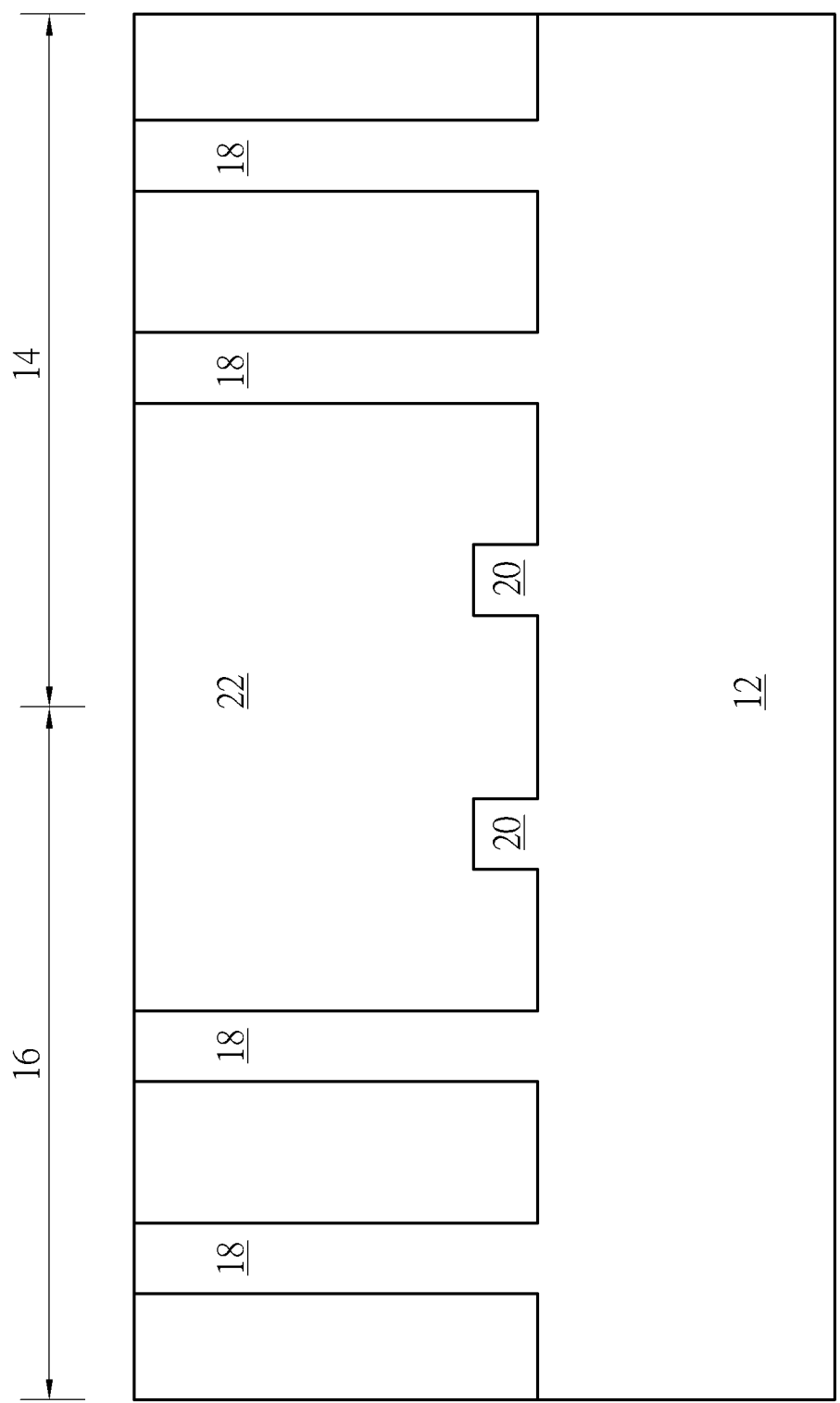
FIGS. 1-6 illustrate a method for fabricating a semiconductor device according to a first embodiment of the present invention.

Referring to FIGS. 1-6, FIGS. 1-6 illustrate a method for fabricating a semiconductor device according to a first embodiment of the present invention. As shown in FIG. 1, a substrate 12, such as a silicon substrate or silicon-on-insulator (SOI) substrate is provided, and a first region and a second region are defined on the substrate 12. In this embodiment, the first region is preferably a NMOS region 14 and the second region is a PMOS region 16, but not limited thereto. Next, at least a fin-shaped structure 18 and a bump 20 are formed on the NMOS region 14 and at least a fin-shaped structure 18 and a bump 20 are formed on the PMOS region 16, in which a hard mask (not shown) composed of silicon oxide or silicon nitride could be formed on each of the fin-shaped structures 18.

It should be noted that even though only one single bump 20 is formed on each of the NMOS region 14 and PMOS region 16, the location and the quantity of the bumps 20 could all be adjusted according to the demand of the product. For instance, it would also be desirable to form a plurality of bumps on each of the NMOS region 14 and PMOS region 16 respectively or form one or more bumps on an intersecting area between NMOS region 14 and PMOS region 16, which are all within the scope of the present invention.

The formation of the fin-shaped structures 18 could be accomplished by first forming a patterned mask (now shown) on the substrate, 12, and then performing an etching process to transfer the pattern of the patterned mask to the substrate 12. Alternatively, the formation of the fin-shaped structure 18 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 18. Moreover, if the substrate 12 were a SOI substrate, a patterned mask could be used to etch a semiconductor layer on the bottom oxide layer without etching through the semiconductor layer for forming the fin-shaped structure 18.

The formation of the bumps 20 could be accomplished by following the aforementioned approach to first form a plurality of fin-shaped structures on the substrate 12, and then using a photo-etching process to lower the height of at least one of the fin-shaped structures for forming the bump 20 on NMOS region 14 and the bump 20 on PMOS region 16. Preferably, the bumps 20 and the fin-shaped structures 18 are composed of same material.

Next, an insulating layer 22 is deposited to cover the fin-shaped structures 18 and bumps 20 on NMOS region 14 and PMOS region 16 as the insulating layer 22 is preferably higher than the top surfaces of the fin-shaped structures 18. Next, a planarizing process, such as chemical mechanical polishing (CMP) process is conducted to remove part of the insulating layer 22 and even part of the fin-shaped structures 18 so that the top surface of the remaining insulating layer 22 is even with the top surface of the fin-shaped structures 18. In this embodiment, the insulating layer 22 is preferably composed of silicon oxide, but not limited thereto.

Figure 2:
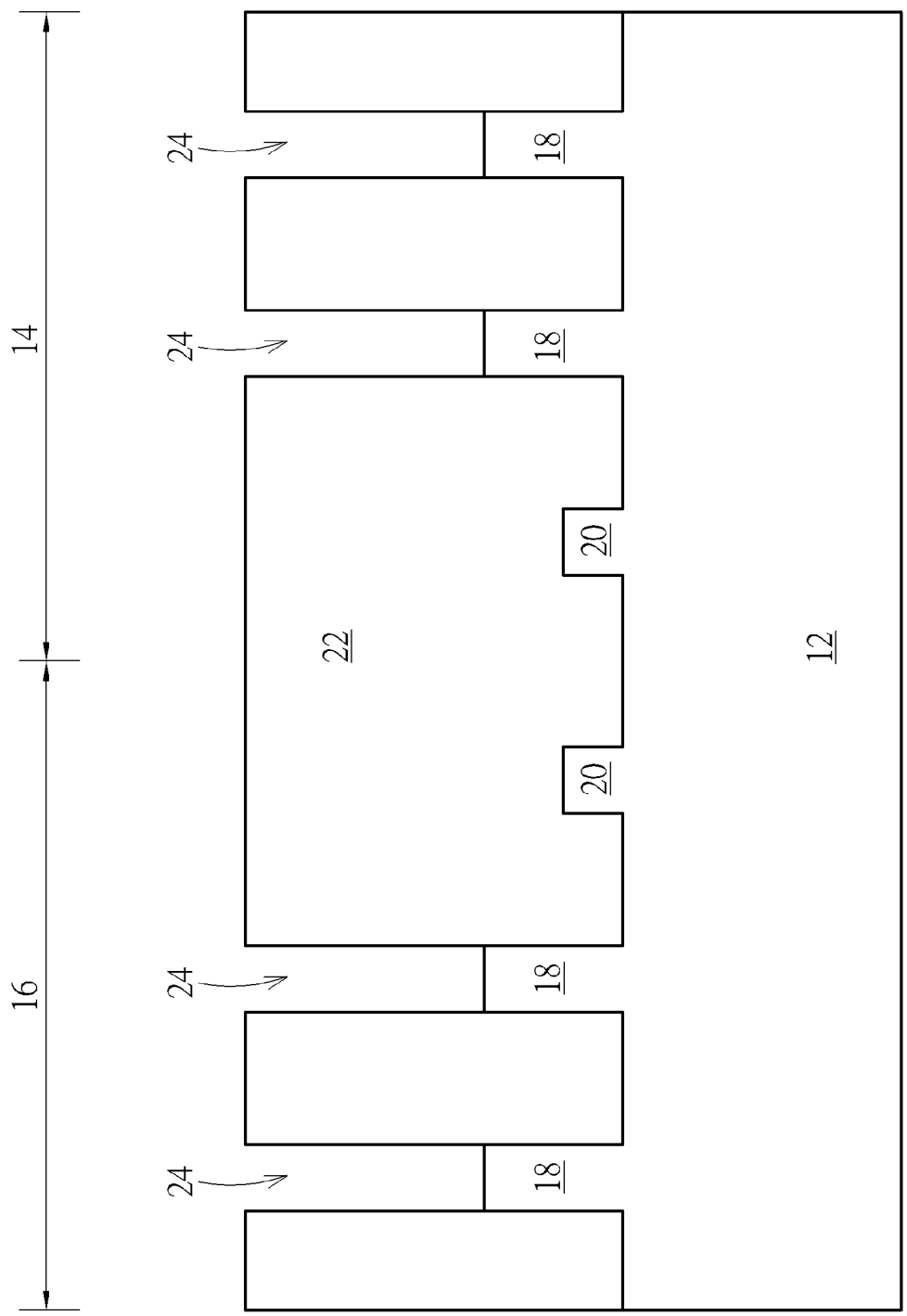

Next, as shown in FIG. 2, an etching process is conducted by using the insulating layer 22 as mask to remove part of the fin-shaped structures 18 on both NMOS region 14 and PMOS region 16 to form openings 24. In this embodiment, the etchant used to remove part of the fin-shaped structures 18 could be selected from the group consisting of ammonium hydroxide (NH$_4$OH), potassium hydroxide (KOH), hydrofluoric acid (HF), and (tetramethylammonium hydroxide, TMAH).

Figure 3:
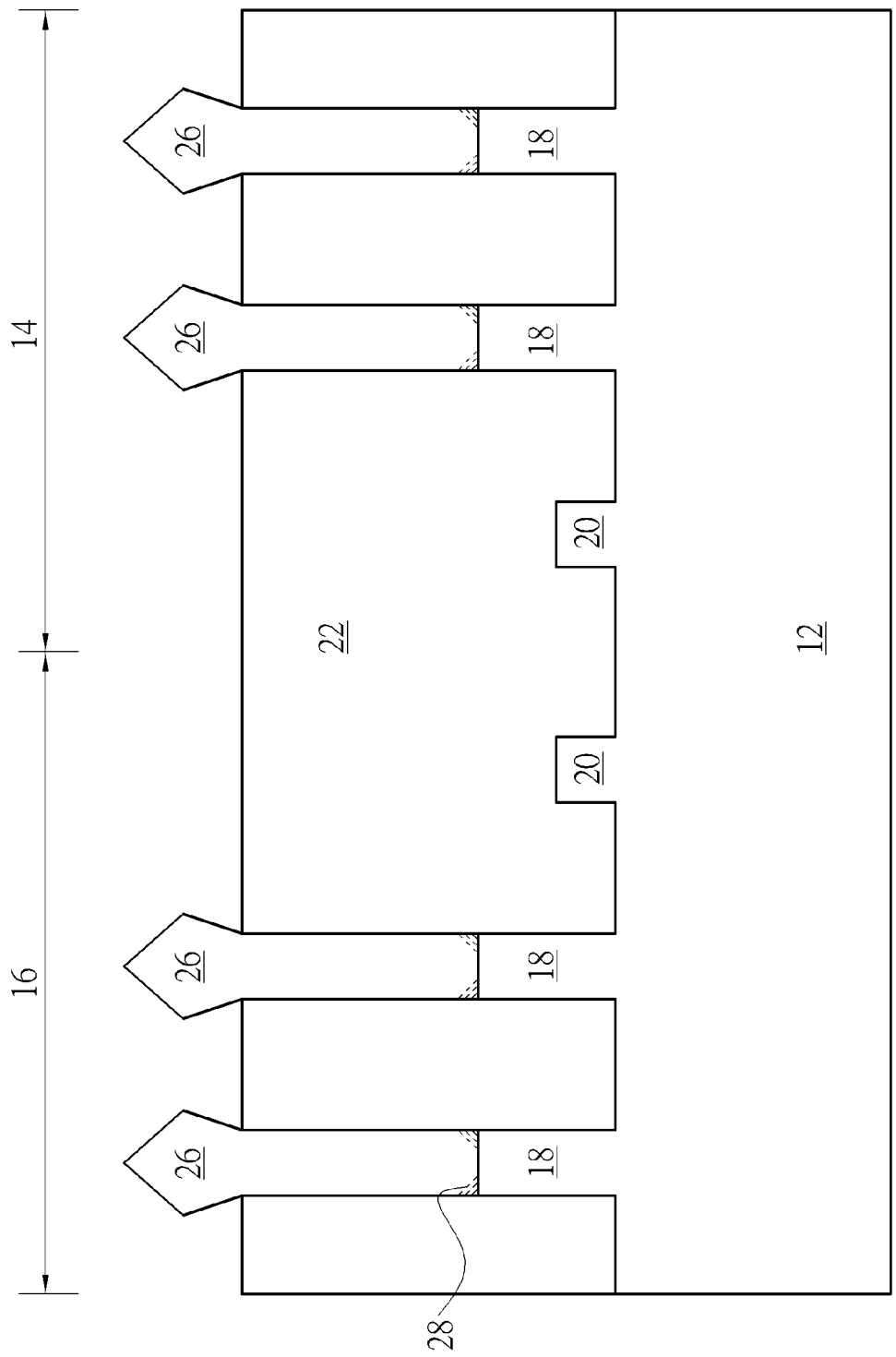

Next, as shown in FIG. 3, an epitaxial growth process is conducted to form an epitaxial layer 26 on each of the fin-shaped structures 18 and filling the openings 24, in which the top surface of the epitaxial layer 26 is preferably higher than the top surface of the insulating layer 22. In this embodiment, the epitaxial growth process could be accomplished by chemical vapor deposition (CVD) processes such as vapor phase epitaxy (VPE) process, ultra-high vacuum CVD process, or molecular beam epitaxy process.

It should be noted that even though the epitaxial layers 26 formed on NMOS region 14 and PMOS region 16 in this embodiment are made of same material, it would also be desirable to form epitaxial layers 26 made of different material on NMOS region 14 and PMOS region 16 according to another embodiment of the present invention. For instance, the epitaxial layer 26 formed on the NMOS region 14 and the epitaxial layer 26 formed on the PMOS region 16 could have different concentration (such as different germanium concentration), the epitaxial layer 26 on the NMOS region 14 and the epitaxial layer 26 on the PMOS region 16 could have different stress or strain, or the epitaxial layer 26 on the NMOS region 14 and the epitaxial layer 26 on the PMOS region 16 could have different concentration and different stress at the same time, which are all within the scope of the present invention.

Moreover, it should be noted that since dislocations are often formed in the epitaxial layer during epitaxial growth process, dislocations 28 are also formed in the epitaxial layer 26 adjacent to or slightly above the fin-shaped structures 18 after the epitaxial growth process is conducted.

Figure 4:
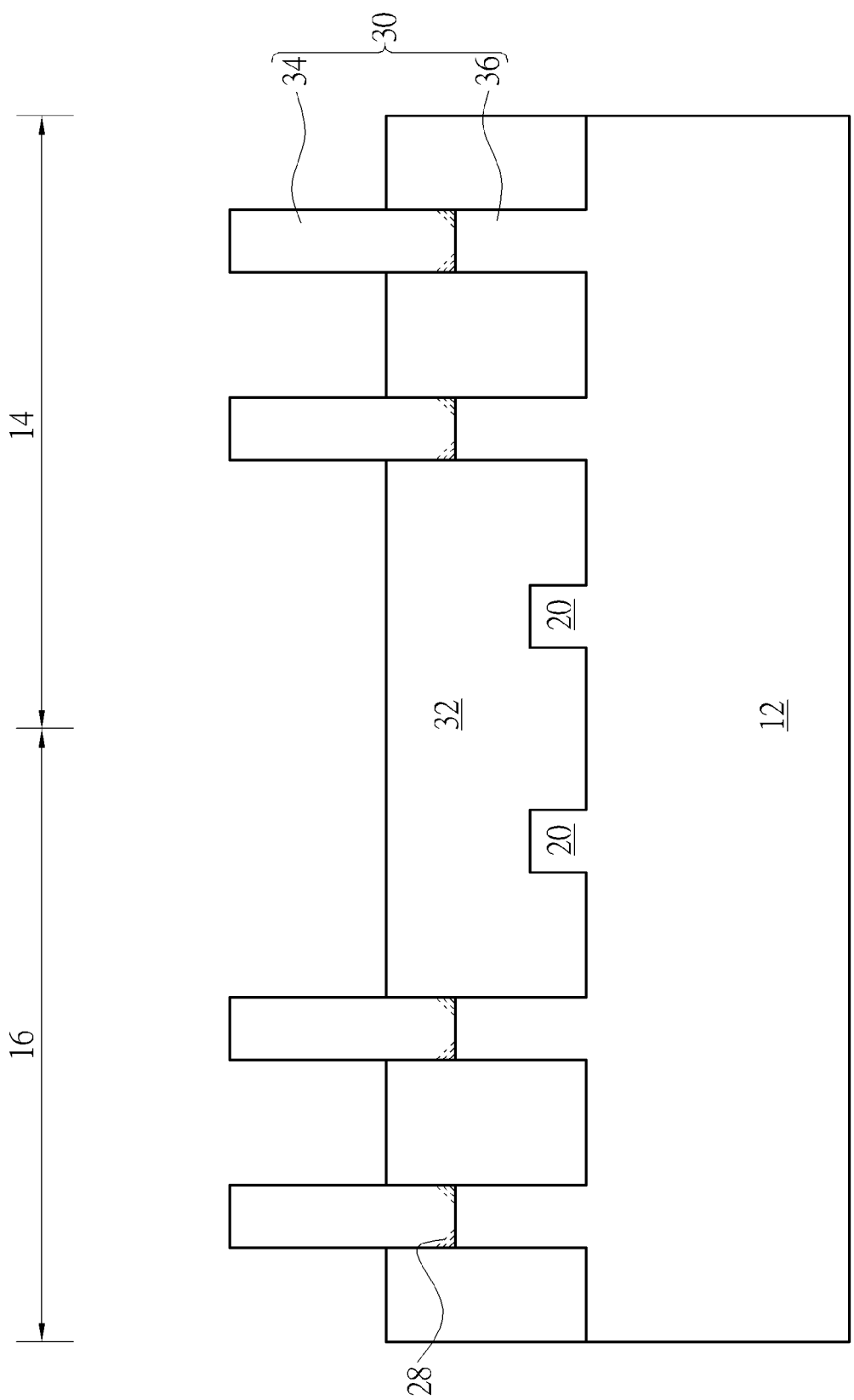

Next, as shown in FIG. 4, a planarizing process, such as CMP is conducted to remove part of the epitaxial layer 26 protruding from the insulating layer 22 and even part of the insulating layer 22 so that the top surface of the epitaxial layer 26 is even with the top surface of the insulating layer 22. Next, an etching process is conducted to remove part of the insulating layer 22 to form multiple fin-shaped structures 30 and a shallow trench isolation (STI) 32 around the fin-shaped structures 30. Preferably, each of the fin-shaped structures 30 includes a top portion 34 and a bottom portion 36, in which the top portions 34 and bottom portions 36 are made of different material while the bottom portions 36 and the bumps 20 are made of same material.

In this embodiment, the bottom portion 36 of each fin-shaped structure 30, the bumps 20, and the substrate 12 are all composed of same material. For instance, the bottom portion 36 of each fin-shaped structure 30, the bumps 20, and the substrate 12 are all composed of silicon while the top portions 34 are composed of epitaxial material. According to other embodiments of the present invention, the materials of the substrate 12, bumps 20, and bottom portions 36 are preferably different from the material of the top portions 34, in which the substrate 12, bumps 20, and bottom portions 36 could be composed of silicon, germanium, SiC, SiGe, GaAs, InP, InGaAs, elementary groups III-V semiconductor, or combination thereof. The top portions 34 of the fin-shaped structures 30 on the other hand could be composed of germanium, silicon, GaAs, AlGaAs, SiGe, GaAsP, or combination thereof.

Viewing from another perspective, the substrate 12, bumps 20, and bottom portions 36 of the fin-shaped structures 30 possess a lattice constant different from that of the top portion 34 of the fin-shaped structures 30, in which the lattice constant herein refers to the lattice constant of an arbitrary region in the substrate 12, bumps 20, top portions 34 of the fin-shaped structures 30 and bottom portions 36 of the fin-shaped structures 30. In some embodiments, the substrate 12, bumps 20, and bottom portions 36 of fin-shaped structures 30 are made of a first material and thus having a first lattice constant, in which the first material may be a single element, a compound, or a mixture. The top portions 34 of fin-shaped structures 30 can be made of a second material or a mix of the first material and the second material, in which the top portions 34 having a second lattice constant that is different from the first lattice constant.

Figure 5:
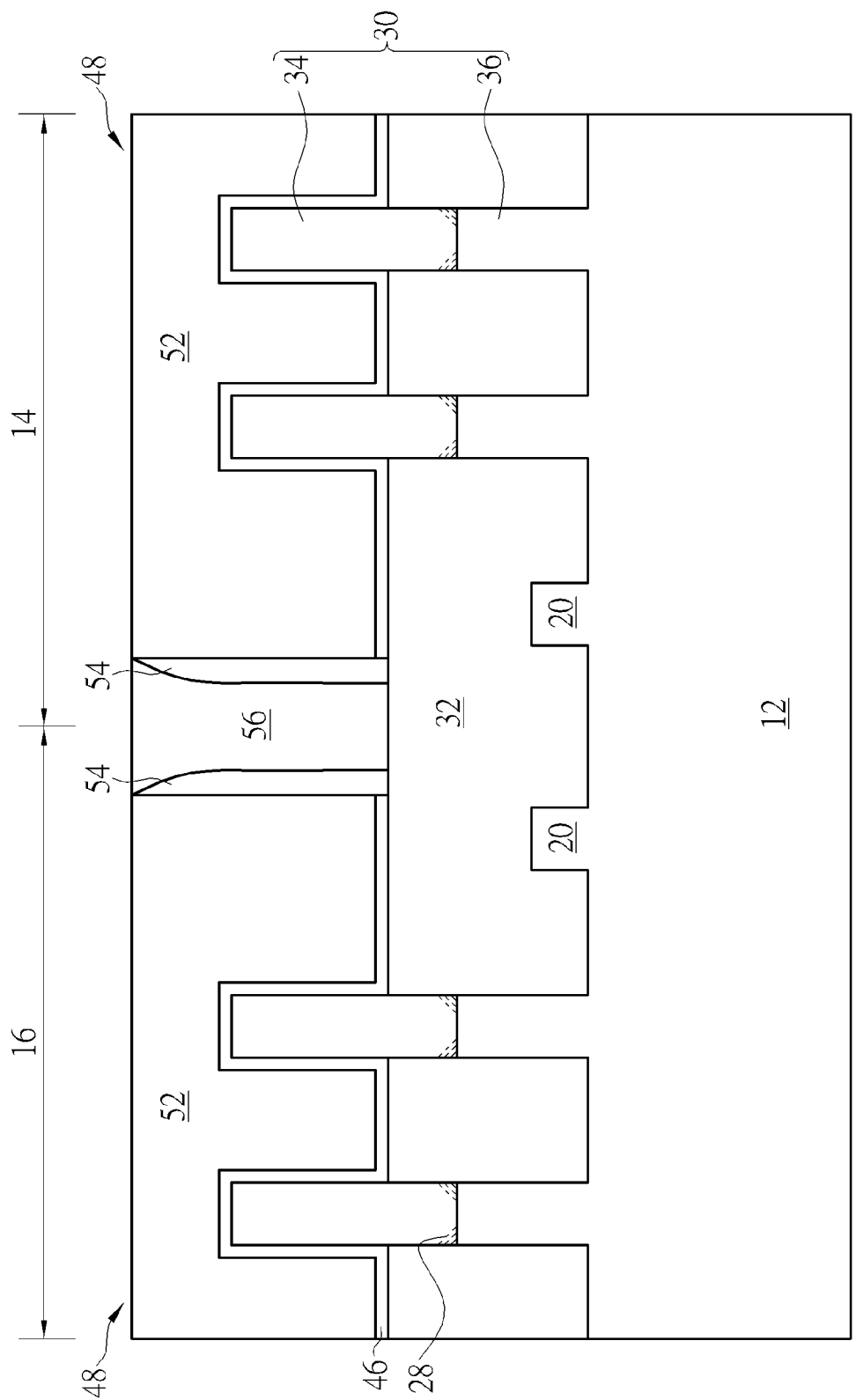

Next, as shown in FIG. 5, follow-up transistor fabrication processes could be carried out to form gate structures. For instance, an interfacial layer (not shown) and/or a gate dielectric layer 46 is formed on the NMOS region 14 and PMOS region 16, and a gate structure 48 is formed on the fin-shaped structures 18 on each of the NMOS region 14 and PMOS region 16. Each of the gate structures 48 is preferably composed of polysilicon material, in which the gate structure 48 on the NMOS region 14 covers or overlaps the fin-shaped structures 30 and bump 20 on the NMOS region 14 and the gate structure 48 on the PMOS region 16 covers or overlaps the fin-shaped structures 30 and bump 20 on the PMOS region 16.

In this embodiment, the formation of the gate structures 48 could be accomplished by a gate first process, a high-k first approach from a gate last process, or a high-k last approach from the gate last process. Since the present embodiment pertains to a high-k last approach, as shown in FIG. 5, it would be desirable to first form the gate structures 48 containing gate dielectric layer 46 and polysilicon material 52 on the fin-shaped structures 30, and then forming spacers 54 adjacent to the sidewalls of the gate structures 48. Preferably, the spacers 54 could be a single spacer or a composite spacer, which could be selected from the group consisting of silicon oxide, silicon nitride, silicon oxynitride, and silicon carbon nitride, but not limited thereto. Next, source/drain regions could be formed in the fin-shaped structures 30 adjacent to two sides of each of the gate structure 48, and elements such as epitaxial layer, silicides, contact etch stop layer (CESL), and interlayer dielectric (ILD) layer 56 could be formed according to the demand of the product.

Figure 6:
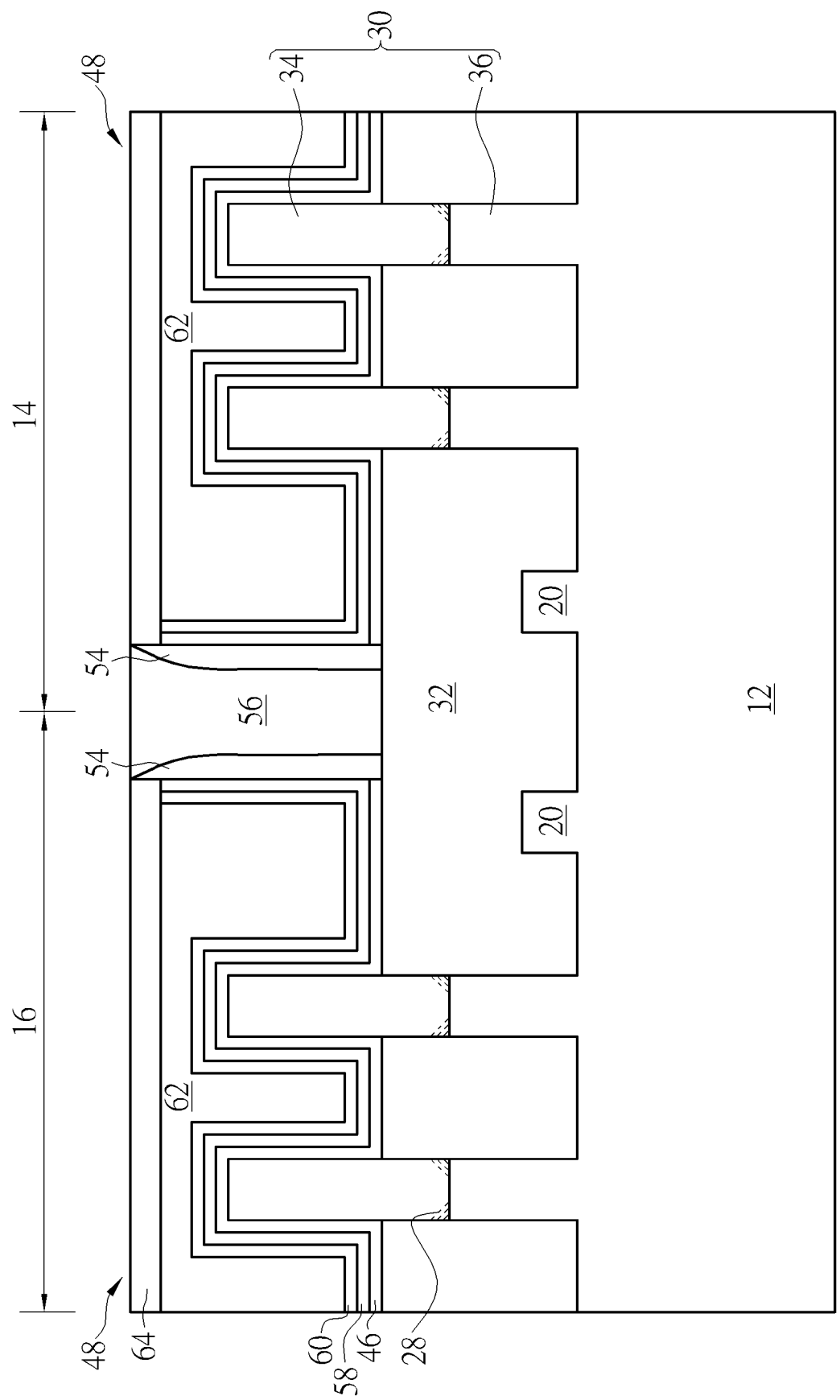

Next, as shown in FIG. 6, a replacement metal gate (RMG) process is conducted to transform the gate structures 48 composed of polysilicon into metal gates. Preferably, each metal gate or gate structure 48 on the NMOS region 14 and the PMOS region 16 includes a U-shaped high-k dielectric layer 58, a U-shaped work function metal layer 60, and a low resistance metal layer 62.

In this embodiment, the high-k dielectric layer 58 is preferably selected from dielectric materials having dielectric constant (k value) larger than 4. For instance, the high-k dielectric layer 58 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

The work function metal layer 60 is formed for tuning the work function of the later formed metal gates to be appropriate in an NMOS or a PMOS. For an NMOS transistor, the work function metal layer 60 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 60 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 60 and the low resistance metal layer 62, in which the material of the barrier layer may include titanium (Ti), titanium nitride (TiN), tantalum (Ta) or tantalum nitride (TaN). Furthermore, the material of the low-resistance metal layer 62 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the high-k dielectric layer 58, part of the work function metal layer 60, and part of the low resistance metal layer 62 are removed to form recesses (not shown), and a hard mask 64 is formed in each recess so that the top surfaces of the hard mask 64 and ILD layer 56 are coplanar. The hard mask 64 could be selected from the group consisting of silicon oxide, silicon nitride, silicon oxynitride, and silicon carbon nitride. This completes the fabrication of a semiconductor device according to a first embodiment of the present invention.

Figure 7:
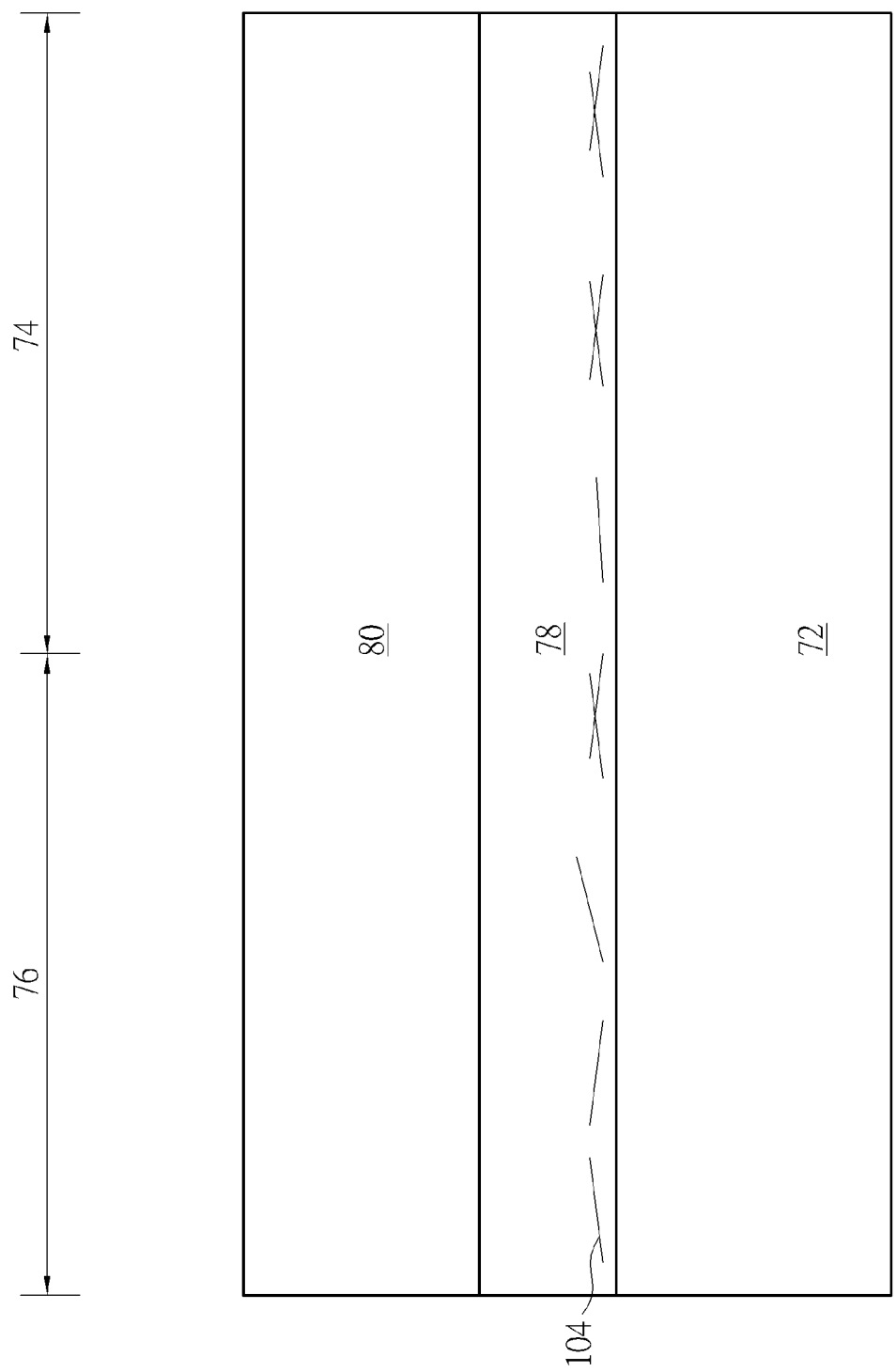
FIGS. 7-9 illustrate a method for fabricating a semiconductor device according to a second embodiment of the present invention.
Figure 8:
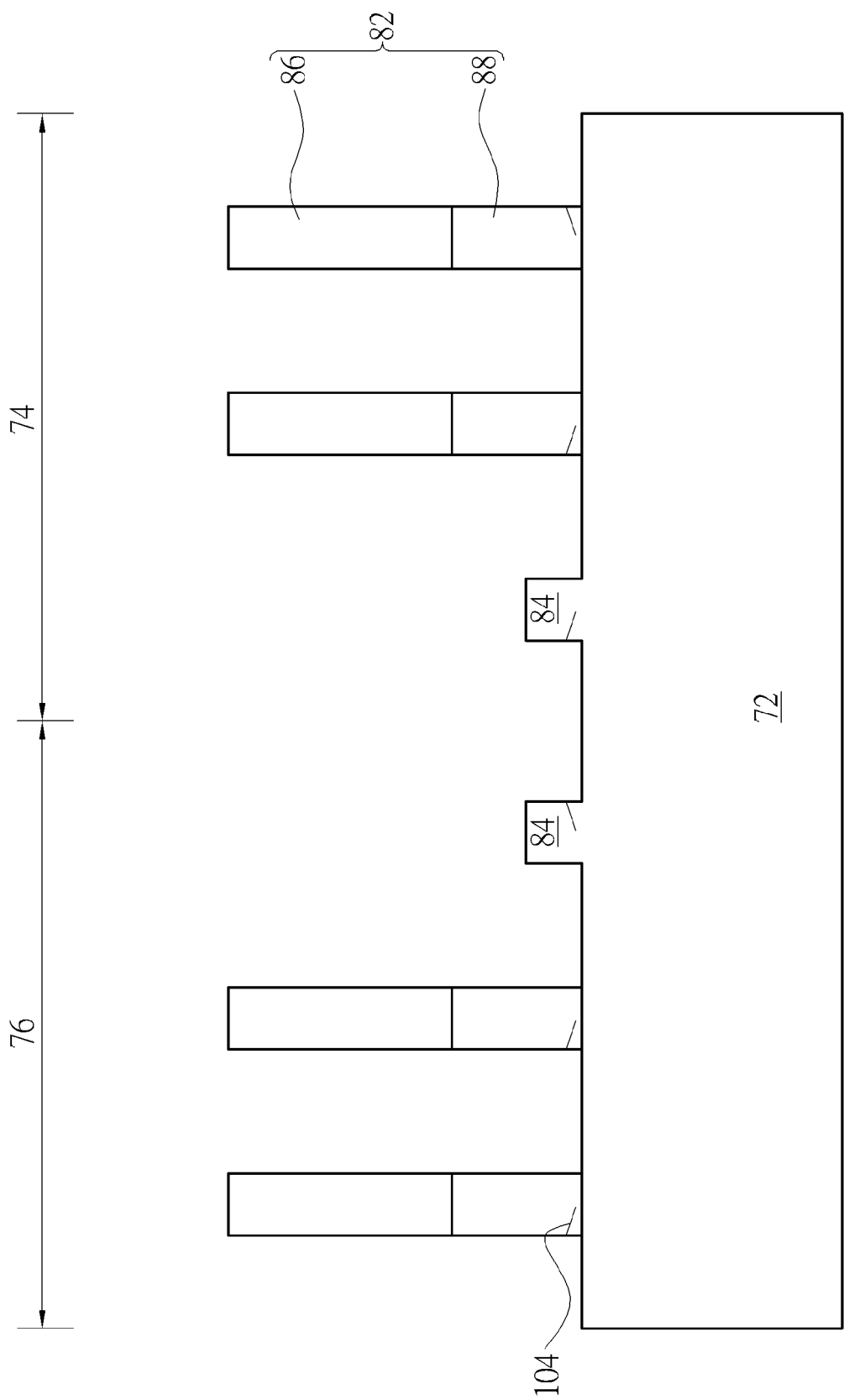
Figure 9:
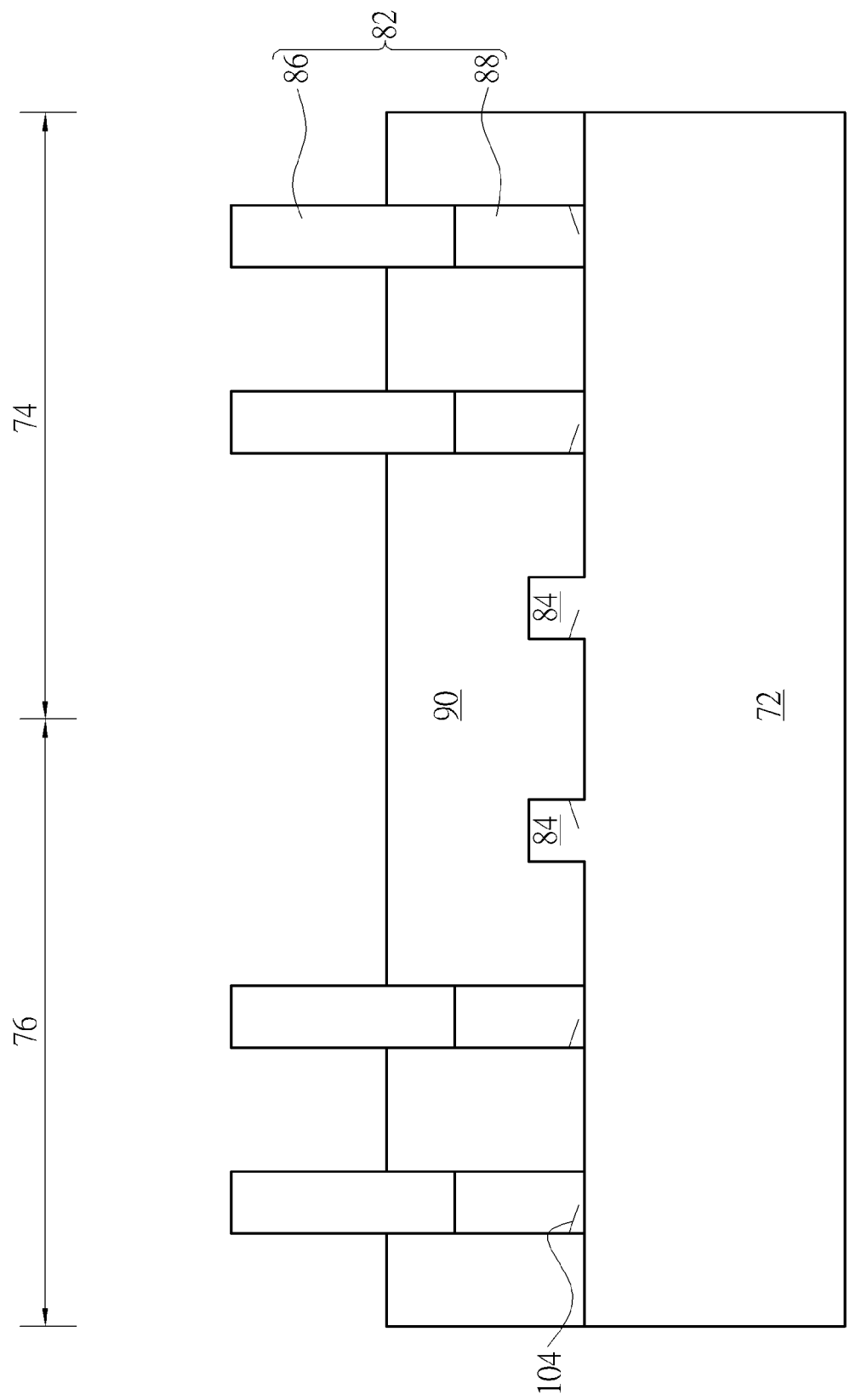

Referring to FIGS. 7-9, FIGS. 7-9 illustrate a method for fabricating a semiconductor device according to a second embodiment of the present invention. As shown in FIG. 7, a substrate 72, such as a silicon substrate or SOI substrate is provided, and a first region and a second region are defined on the substrate 72. In this embodiment, the first region is preferably a NMOS region 74 and the second region is a PMOS region 76, but not limited thereto.

Next, a first epitaxial layer 78 and a second epitaxial layer 80 are formed on the substrate 72. Preferably, at least a dislocation 104 is formed in the bottom portion of the first epitaxial layer 78 adjacent to the substrate 72 after the epitaxial layers are formed. Moreover, the first epitaxial layer 78 and second epitaxial layer 80 are preferably composed of different material and/or having different lattice constant, in which the first epitaxial layer 78 and second epitaxial layer 80 could be composed of Ge, Si, GaAs, AlGaAs, SiGe, GaAsP, or combination thereof.

It should be noted that even though the first epitaxial layer 78 and second epitaxial layer 80 on both NMOS region 74 and PMOS region 76 are made of same material in this embodiment, it would also be desirable to form first epitaxial layer 78 and second epitaxial layer 80 composed of different material on NMOS region 74 and PMOS region 76 respectively. For instance, the first epitaxial layer 78 on the NMOS region 74 and the first epitaxial layer 78 on the PMOS region 76 could be composed of different material, the second epitaxial layer 80 on the NMOS region 74 and the second epitaxial layer 80 on the PMOS region 76 could be composed of different material, or both the first epitaxial layer 78 and second epitaxial layer 80 on NMOS region 74 and both the first epitaxial layer 78 and second epitaxial layer 80 on PMOS region 76 are composed of different material. Preferably, the definition of epitaxial layers composed of different material in this embodiment refers to that the two layers could have different concentration (such as germanium concentration) or different stress, which are all within the scope of the present invention.

Next, as shown in FIG. 8, a pattern transfer process is conducted to first form a patterned resist (not shown) on the second epitaxial layer 80, and then conduct an etching process by using the patterned resist as mask to remove part of the second epitaxial layer 80 and part of the first epitaxial layer 78 for forming fin-shaped structures 82 on the substrate 72. Next, a fin-cut process or another photo-etching process is conducted to remove part of the second epitaxial layer 80 and part of the first epitaxial layer 78 for forming bumps 84 on NMOS region 74 and PMOS region 76 respectively. At this stage, each of the fin-shaped structures 82 preferably includes a top portion 86 and a bottom portion 88, in which the top portions 86 and bottom portions 88 are composed of different material while the bottom portions 88 and the bumps 84 are composed of same material. As stated above, dislocations 104 are formed in the bottom region of the bottom portions 88 and the bumps 84 after epitaxial layers are formed.

Next, as shown in FIG. 9, a STI 90 is formed on the bumps 84 and surrounding the fin-shaped structures 82. In this embodiment, the formation of the STI 90 could be accomplished by first depositing an insulating layer (not shown) to cover the fin-shaped structures 82 and bumps 84 on both NMOS region 74 and PMOS region 76 as the top surface of the insulating layer being higher than the top surface of the fin-shaped structures 82, and then conducting a planarizing process, such as using CMP to remove part of the insulating layer or even part of the fin-shaped structures 82 so that the top surface of the remaining insulating layer is even with the top surface of the fin-shaped structures 82. In this embodiment, the insulating layer is preferably composed of silicon oxide, but not limited thereto. Next, an etching process is conducted to remove part of the insulating layer so that the top surface of the remaining insulating layer is higher than the bumps 84 and bottom portions 88 but lower than the top portions 86 of the fin-shaped structures 82.

Next, gate structures are formed on the NMOS region 74 and PMOS region 76 by following the same steps disclosed in the aforementioned first embodiment, and a RMG process is conducted to transform gate structures composed of polysilicon into metal gates. Similar to the first embodiment, the metal gate on each transistor region preferably overlaps or covers the fin-shaped structures and bumps on that region. For instance, the metal gate on the NMOS region 74 preferably covers the fin-shaped structures 82 and bumps 84 on the NMOS region 74, and the metal gate on the PMOS region 76 covers the fin-shaped structures 82 and bumps 84 on the PMOS region 76.

Figure 10:
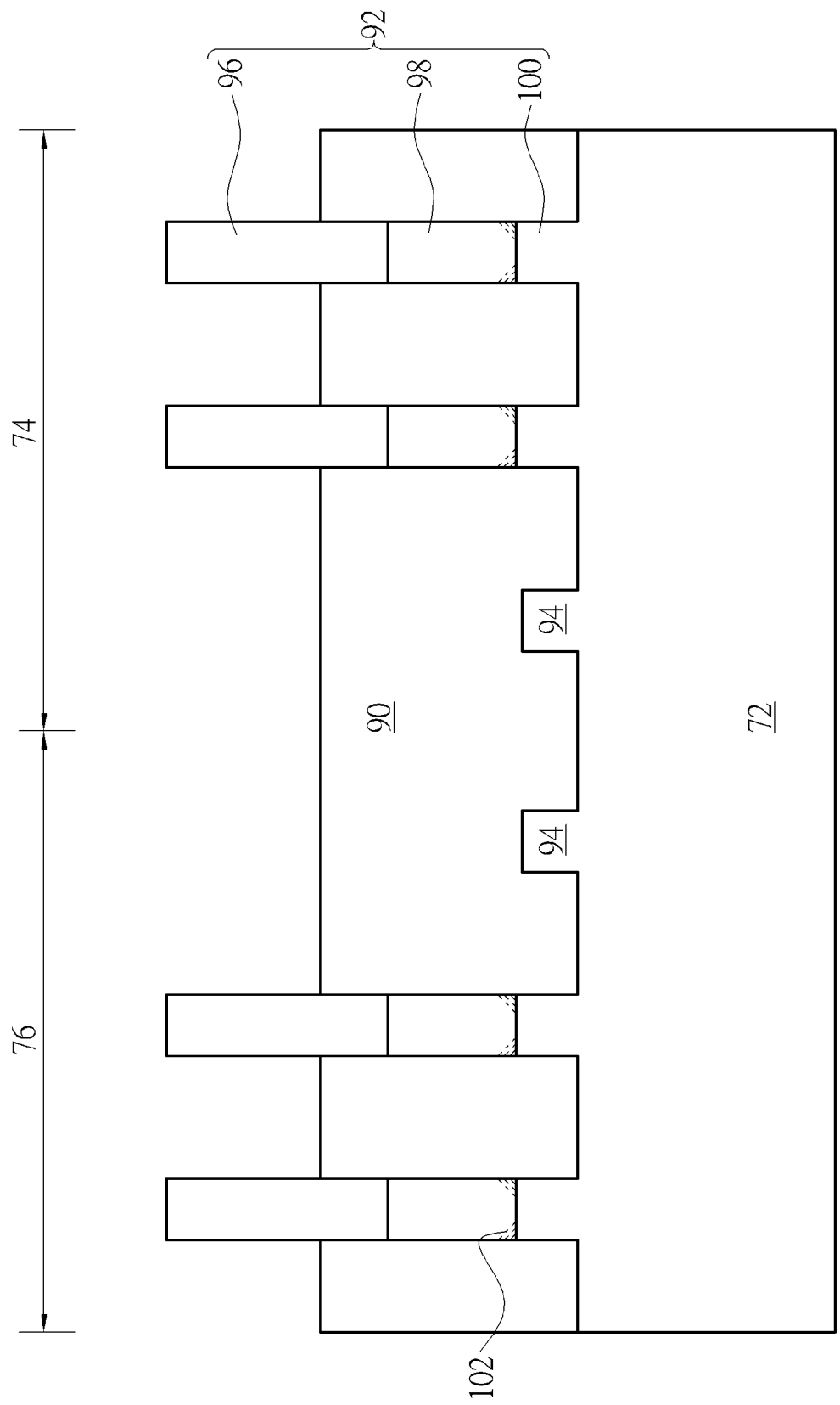
FIG. 10 illustrates a structural view of a semiconductor device according to a third embodiment of the present invention.

Referring to FIG. 10, FIG. 10 illustrates a structural view of a semiconductor device according to a third embodiment of the present invention. As shown in FIG. 3, it would be desirable to conduct a photo-etching process to remove part of the second epitaxial layer 80, part of the first epitaxial layer 78, and part of the substrate 72 for forming fin-shaped structures 92 after the first epitaxial layer 78 and second epitaxial layer 80 are formed in FIG. 7. Next, a fin-cut process or another photo-etching process is conducted to remove part of the second epitaxial layer 80 and part of the first epitaxial layer 78 for forming bumps 94 on the NMOS region 74 and PMOS region 76. In this embodiment, each of the fin-shaped structures 92 includes a top portion 96, a middle portion 98, and a bottom portion 100, in which the top portions 96, the middle portions 98, and the bottom portions 100 are preferably made of different material and/or having different lattice constant while the bottom portions 100 and the bumps 94 are composed of same material and/or having same lattice constant.

Specifically, the top portions 96 and bottom portions 98 of the fin-shaped structures 92 are composed of epitaxial material. For instance, the middle portions 98 include the first epitaxial layer 78, the top portions 96 include the second epitaxial layer 80, and the bottom portions 100 and the bumps 94 are composed of silicon. Viewing from another perspective, the top surface of each bump 94 is preferably even to the top surface of the bottom portions 100 or could be slightly lower than the top surface of the bottom portions 100.

Moreover, a STI 90 is formed on the bumps 94 and around the fin-shaped structures 92, in which the top surface of the STI 90 is preferably higher than the top surface of the middle portions 98. Nevertheless, the top surface of the STI 90 could also be slightly lower than the top surface of the middle portions 98 while still covering the bumps 94. Furthermore, at least one or more dislocations 102 are formed in the fin-shaped structures 92, in which the dislocations 102 are preferably in the lower part of middle portions 98 in proximity to the bottom portions 100.

Figure 11:
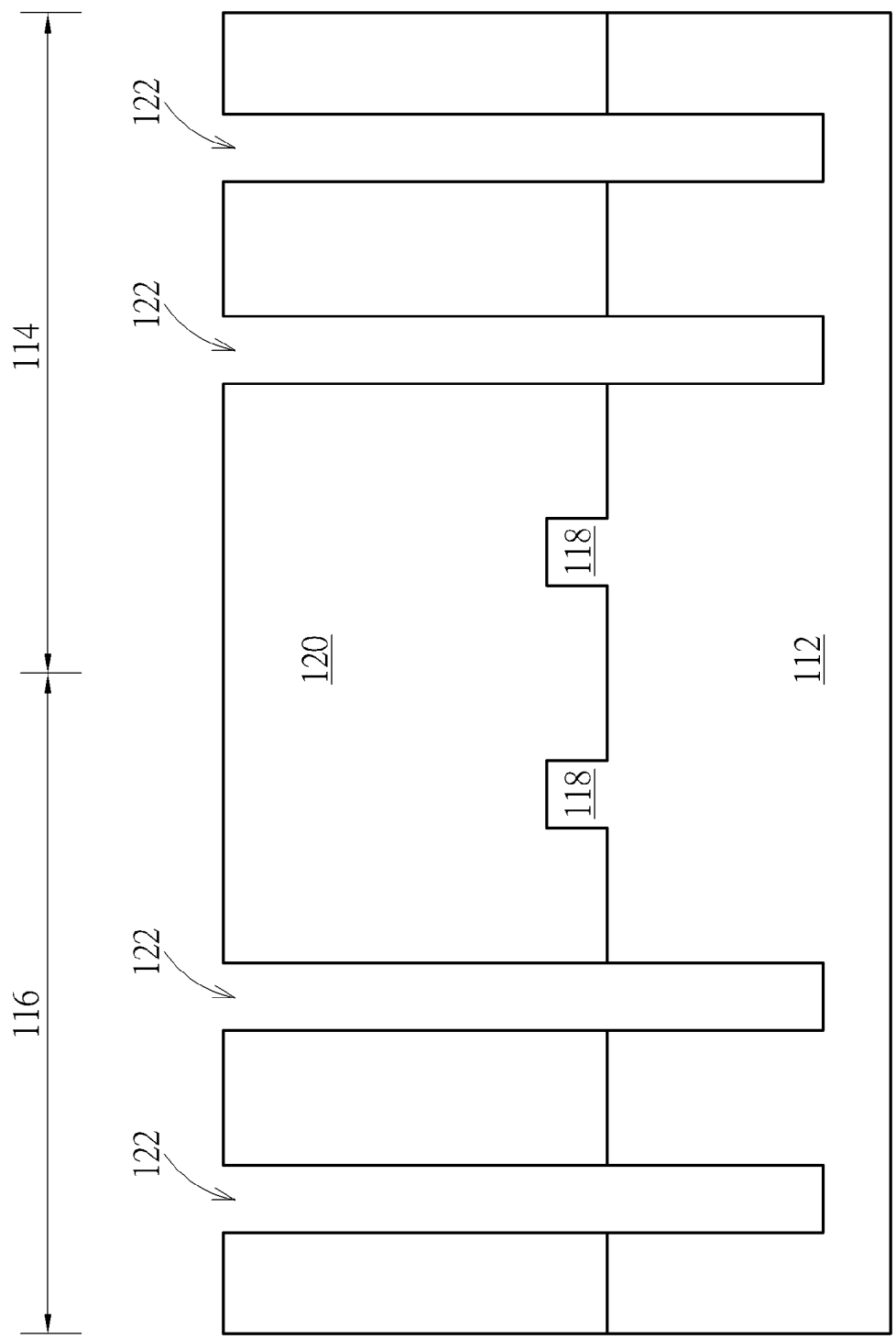
FIGS. 11-12 illustrate a method for fabricating a semiconductor device according to a fourth embodiment of the present invention.
Figure 12:
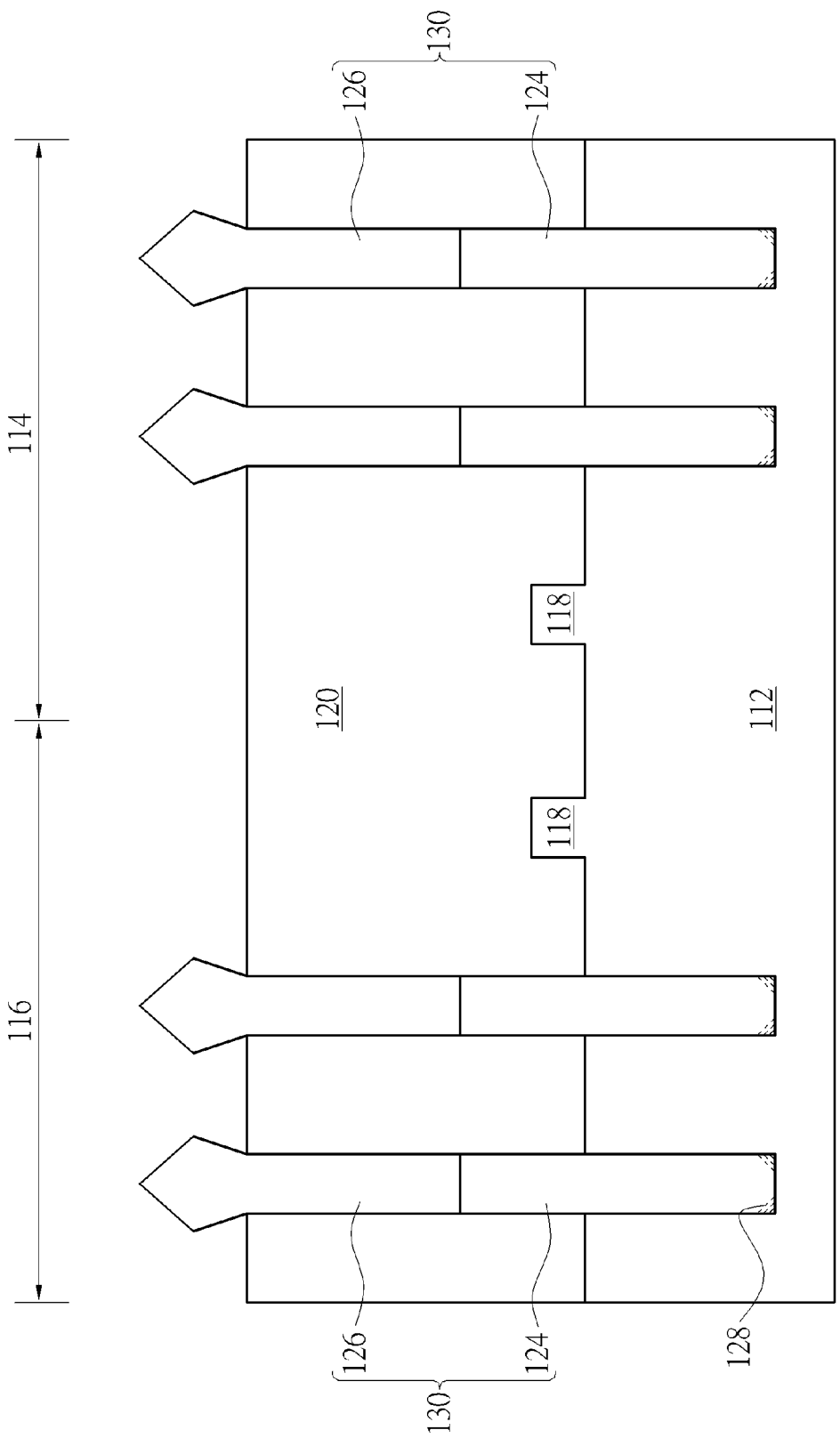

Referring to FIGS. 11-12, FIGS. 11-12 illustrate a method for fabricating a semiconductor device according to a fourth embodiment of the present invention. As shown in FIG. 11, a substrate 112, such as a silicon substrate or SOI substrate is provided, and a first region and a second region are defined on the substrate 112. In this embodiment, the first region is preferably a NMOS region 114 and the second region is a PMOS region 116, but not limited thereto.

Next, at least a bump 118 is formed on the NMOS region 114 and at least a bump 118 is formed on the PMOS region 116. It should be noted that even though a single bump 118 is formed on each of the NMOS region 114 and PMOS region 116, the location and the quantity of the bumps 118 could all be adjusted according to the demand of the product. For instance, it would also be desirable to form a plurality of bumps on each of the NMOS region 114 and PMOS region 116 respectively or form one or more bumps on an intersecting area between NMOS region 114 and PMOS region 116, which are all within the scope of the present invention.

The formation of the bumps 118 could be accomplished by following the aforementioned approach to first form a plurality of fin-shaped structures on the substrate 112, and then using a photo-etching process to lower the height of at least one of the fin-shaped structures for forming the bump 118 on NMOS region 114 and the bump 118 on PMOS region 116.

Next, an insulating layer 120 is deposited to cover the bumps 118 on NMOS region 114 and PMOS region 116, and a photo-etching process is conducted to remove part of the insulating layer 120 and part of the substrate 112 for forming openings 122 on NMOS region 114 and PMOS region 116, in which the bottom surface of each opening 122 is lower than the top surface of the substrate 112. In this embodiment, the insulating layer 120 is preferably composed of silicon oxide, but not limited thereto.

Next, as shown in FIG. 12, a first epitaxial layer 124 and a second epitaxial layer 126 are sequentially deposited into the openings 122 and filling the openings 122 completely to form fin-shaped structures 130. In this embodiment, the first epitaxial layer 124 and second epitaxial layer 126 are preferably composed of different material and/or having different lattice constant, in which the first epitaxial layer 124 and second epitaxial layer 126 could be composed of Ge, Si, GaAs, AlGaAs, SiGe, GaAsP, or combination thereof.

Similar to the aforementioned embodiment, even though the first epitaxial layer 124 and second epitaxial layer 126 on both NMOS region 114 and PMOS region 116 are made of same material in this embodiment, it would also be desirable to form the first epitaxial layer 124 and second epitaxial layer 126 composed of different material on NMOS region 114 and PMOS region 116 respectively. For instance, the first epitaxial layer 124 on the NMOS region 114 and the first epitaxial layer 124 on the PMOS region 116 could be composed of different material, the second epitaxial layer 126 on the NMOS region 114 and the second epitaxial layer 126 on the PMOS region 116 could be composed of different material, or both the first epitaxial layer 124 and second epitaxial layer 126 on NMOS region 114 and both the first epitaxial layer 124 and second epitaxial layer 126 on PMOS region 116 are composed of different material. Preferably, the definition of epitaxial layers composed of different material in this embodiment refers to that the two layers could have different concentration (such as germanium concentration) or different stress, which are all within the scope of the present invention.

It should also be noted that since dislocations are usually formed during the formation of the first epitaxial layer 124, at least a dislocation 128 is formed in the bottom region of the first epitaxial layer 124 adjacent to the substrate 112 after the first epitaxial layer 124 is formed. In this embodiment, the top surface of the first epitaxial layer 124 is slightly higher than the top surface of the bumps 118, and the dislocations 128 are preferably lower than the top surface of the substrate 112.

Figure 13:
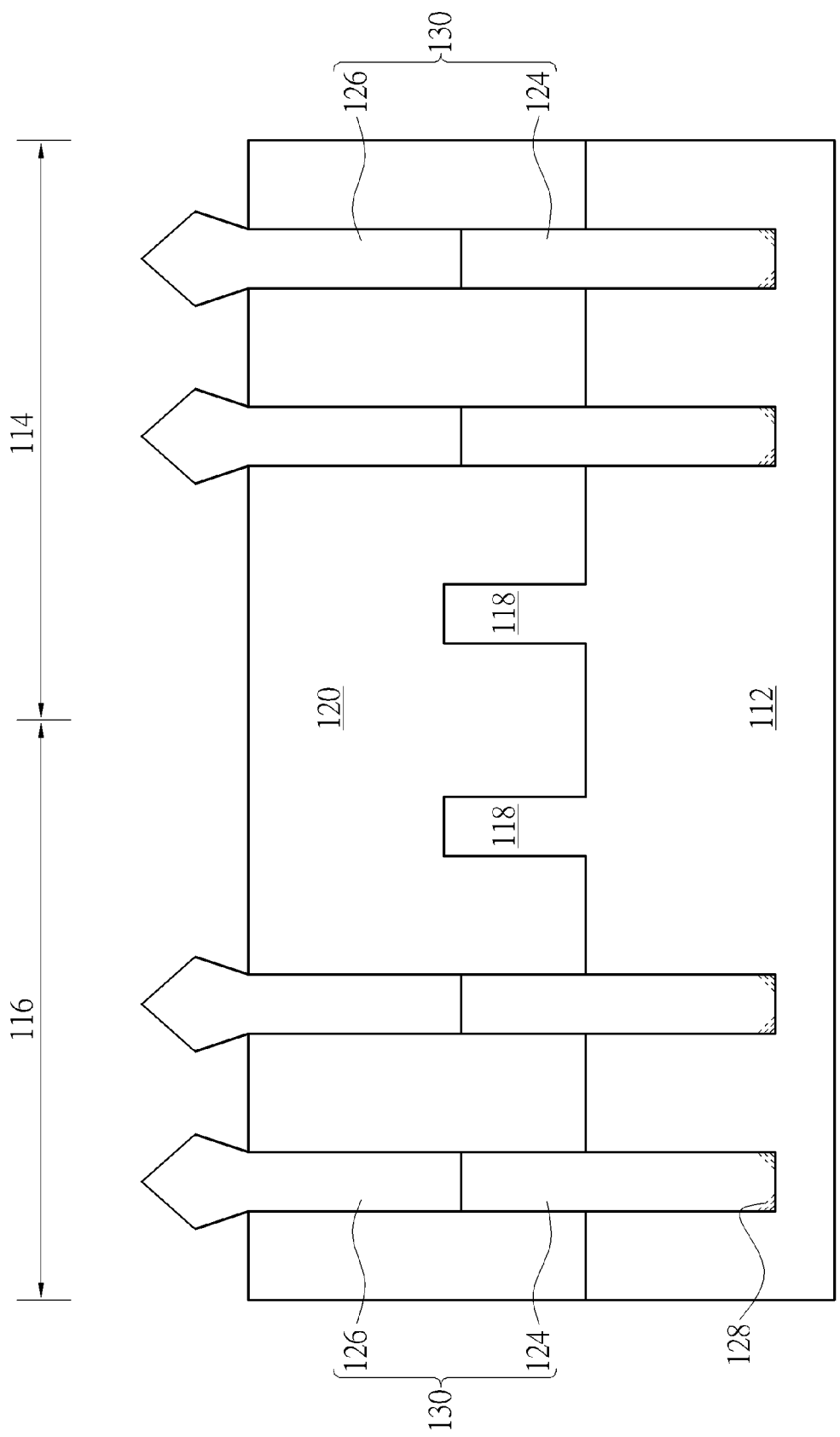
FIG. 13 illustrates a structural view of a semiconductor device according to a fifth embodiment of the present invention.

Referring again to FIG. 13, in which FIG. 13 further illustrates a structural view of a semiconductor device according to a fifth embodiment of the present invention. As shown in FIG. 13, a plurality of fin-shaped structures 130 are formed on the NMOS region 114 and PMOS region 116, in which each of the fin-shaped structures 130 includes a first epitaxial layer 124 and a second epitaxial layer 126. In contrast to the embodiment shown in FIG. 12, the top surface of the bumps 118 is higher than the top surface of the first epitaxial layer 124.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a first region and a second region;
   forming a first fin-shaped structure and a bump on the first region of the substrate, wherein the first fin-shaped structure and the bump comprise different material, the first fin-shaped structure comprises a top portion and a bottom portion, and the top portion and the bottom portion comprise different material;
   forming a second fin-shaped structure and the bump on the substrate;
   forming an insulating layer on the bump and around the second fin-shaped structure;
   removing part of the second fin-shaped structure;

forming an epitaxial layer on the remaining second fin-shaped structure after removing part of the second fin-shaped structure;

planarizing the epitaxial layer; and removing part of the insulating layer to form a shallow trench isolation (STI) on the bump and the first fin-shaped structure protruding from the STI, wherein a top surface of the bottom portion is lower than a top surface of the STI on both the first region and the second region and higher than a top surface of the bump.

2. The method of claim 1, further comprising forming a dislocation in a bottom portion of the epitaxial layer.

3. A method for fabricating a semiconductor device, comprising:

providing a substrate;

forming a first fin-shaped structure and a bump on the substrate;

forming an insulating layer on the bump and around the first fin-shaped structure;

removing part of the first fin-shaped structure;

forming an epitaxial layer on the remaining first fin-shaped structure after removing part of the first fin-shaped structure;

planarizing the epitaxial layer; and removing part of the insulating layer to form a shallow trench isolation (STI) and a second fin-shaped structure protruding from the STI, wherein the second fin-shaped structure and the bump comprise different material, the second fin-shaped structure comprises a top portion and a bottom portion, the top portion and the bottom portion comprise different material, and a top surface of the bottom portion is lower than a top surface of the STI and higher than a top surface of the bump.

* * * * *